United States Patent [19]

Yokoyama

[11] Patent Number: 4,821,090

[45] Date of Patent: Apr. 11, 1989

[54] COMPOUND SEMICONDUCTOR INTEGRATED CIRCUIT DEVICE

[75] Inventor: Naoki Yokoyama, Atsugi, Japan

[73] Assignee: Fujitsu Limited, Kawasaki, Japan

[21] Appl. No.: 31,228

[22] Filed: Mar. 30, 1987

Related U.S. Application Data

[63] Continuation of Ser. No. 676,828, Nov. 30, 1984, abandoned.

[30] Foreign Application Priority Data

Dec. 5, 1983 [JP] Japan .................................. 58-229431

[51] Int. Cl.[4] ............................................ H01L 27/02
[52] U.S. Cl. ........................................ 357/43; 357/55; 357/22; 357/16; 357/56
[58] Field of Search .................... 357/43, 55, 16, 22 G, 357/22 A, 22 H, 56, 22 F, 22 J, 22 MD, 23.7

[56] References Cited

U.S. PATENT DOCUMENTS

| | | | |
|---|---|---|---|
| 4,016,593 | 4/1977 | Konishi et al. | 357/55 X |
| 4,063,271 | 12/1977 | Bean et al. | 357/22 G X |
| 4,163,237 | 7/1979 | Dingle et al. | 357/16 |
| 4,380,774 | 4/1983 | Yoder | 357/16 |
| 4,424,525 | 1/1984 | Mimura | 357/16 |
| 4,586,071 | 4/1986 | Tiwari | 357/16 X |
| 4,590,502 | 5/1986 | Morkoc | 357/16 X |
| 4,593,305 | 6/1986 | Kurata et al. | 357/34 |
| 4,593,457 | 6/1986 | Birrihella | 357/16 X |

FOREIGN PATENT DOCUMENTS 0162541 11/1985 European Pat. Off. .......... 357/16 X
58-91681 5/1983 Japan ............................. 357/22 MD

OTHER PUBLICATIONS

Fischer et al, "New High-Speed (Al,Ga)As Modulation Doped Field-Effect Transistors", *IEEE Circuits and Devices Magazine*, Jul. 1985, pp. 35–38.

Kroemer, "Heterojunction Bipolar Transistors and Integrated Circuits", *Proceedings of the IEEE*, vol. 70, No. 1, Jan. 1982, pp. 13–25.

IEEE Spectrum, vol. 20, No. 12, Dec. 1983, "Integrated Circuits: The Case for Gallium Arsenide", by Eden et al., pp. 30–37.

Proceedings of the IEEE, vol. 70, No. 1, Jan. 1982, "High Speed GaAs Integrated Circuits", by Long et al., pp. 35–45.

*Primary Examiner*—Andrew J. James
*Assistant Examiner*—William A. Mintel
*Attorney, Agent, or Firm*—Staas & Halsey

[57] ABSTRACT

A compound semiconductor integrated circuit device including a heterojunction bipolar transistor and a field effect transistor. The heterojunction bipolar transistor has three compound semiconductor layers (type n-p-n or p-n-p) and makes a channel region or a channel-electron-supplying region of a field effect transistor with one of the three compound semiconductor layers.

20 Claims, 2 Drawing Sheets

COMPOUND SEMICONDUCTOR INTEGRATED CIRCUIT DEVICE

This is a continuation of co-pending application Ser. No. 676,828 filed on Nov. 30, 1984, now abandoned.

BACKGROUND OF THE INVENTION

1. Field of the Invention

The present invention relates to a compound semiconductor integrated circuit (IC) device, more particularly to a compound semiconductor IC device including bipolar transistors and field effect transistors (FET's).

2. Description of the Related Art

Silicon semiconductor devices have played a leading role in the development of microelectronics. Recently, however, compound semiconductor devices using a compound semiconductor such as gallium arsenic (GaAs), having a carrier mobility larger than that of silicon, have been developed in order to obtain increased operating speeds and decreased power consumptions over silicon semiconductor devices.

One of the main compound semiconductor transistors developed has been a compound semiconductor FET, due to, for example, the ease of the fabrication procedures. In particular, metal-semiconductor FET's (MESFET's) and junction-type FET's (JFET's) have been developed. A heterojunction type FET has also been proposed in which the carrier mobility is increased by isolating the region where the carriers (electrons) move from the region where the carriers are produced, thus eliminating any scattering of carriers by impurities doped to create the carriers.

With the recent advances in fabrication procedures, many compound semiconductor bipolar transistors have also been proposed. Particular promise is offered by heterojunction-type bipolar transistors, in which an emitter region and optionally a collector region consist of a compound semiconductor having a forbidden energy band gap larger than that of a base region. These allow independent control of flows of electrons and holes through the difference of the energy band gaps at the heterojunction interfaces, thus enabling increased electron injection efficiency and decreased emitter capacitance and base resistance.

In compound semiconductor devices, circuit integration has been tried but such compound semiconductor integrated circuit devices include only equivalent transistors and do not include both FET's and bipolar transistors. This limits the usefulness of compound semiconductor IC devices.

SUMMARY OF THE INVENTION

The object of the present invention is to provide a compound semiconductor IC device including both FET's and bipolar transistors and to overcome various limitations of prior art silicon and compound semiconductor IC devices.

This and other objects, features, and advantages of the present invention are attained by providing a compound semiconductor IC device, including a bipolar transistor and an FET. The device includes a substrate, a first compound semiconductor layer of one conductivity on the substrate, a second compound semiconductor layer of another conductivity on the first compound semiconductor layer, and a third compound semiconductor layer of the one conductivity on the second semi-conductor layer. At least one of the first and third compound semiconductor layers has a forbidden energy band gap larger than that of the second compound semiconductor layer. The bipolar transistor includes a base region of the second compound semiconductor layer and an emitter region of one of the first and third compound semiconductor layers which has a forbidden energy band gap larger than that of the second compound semiconductor layer in a first area of the device. The FET includes a channel region or a region for supplying electrons to a channel region of one of the first, second, and third compound semiconductor layers in a second area of the device.

BRIEF DESCRIPTION OF THE DRAWINGS

The present invention will be illustrated in more detail by example with reference to the drawings.

DESCRIPTION OF THE PREFERRED EMBODIMENTS

Figure 1:
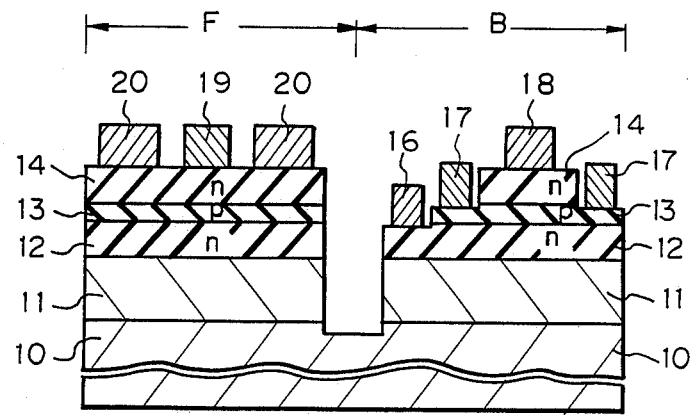
FIG. 1 is a sectional view of a first preferred embodiment of a compound semiconductor IC device in accordance with the present invention.

FIG. 1 illustrates a compound semiconductor IC device which has an n-p-n type heterojunction bipolar transistor in an area B and a MESFET in an area F. In the figure, reference numeral 12 denotes an n-type $Al_x Ga_{1-x}As$ layer, 13 a p-type GaAs layer, 14 an n-type GaAs layer, and 16 to 20 electrodes. The layers 12 to 14 in the area B constitute the emitter, base and collector regions, respectively, of a bipolar transistor with a heterojunction between the emitter and base regions and the layer 14 in the area F constitutes a channel region of a MESFET.

The device is constituted as shown for the reason that, first, a bipolar transistor is preferably an n-p-n type so that the major carriers of the bipolar transistor are the electrons.

Second, the layer 14 should preferably be a collector region and the layer 12 an emitter region since, if the layer 12 were a collector region, the collector capacitance would be increased due to the longer horizontal length of the layer 12 over the layer 14, decreasing the switching speed of the device. Therefore, a heterojunction should be formed between the layers 12 and 13, i.e., the emitter and base regions. The forbidden energy band gap of $Al_x Ga_{1-x}As$ is larger than that of GaAs. Thus, the layers 12 and 13 are made of AlGaAs and GaAs respectively.

Third, a channel region of an FET preferably is made of an n-type layer so that the carrier is the electron. GaAs is preferred to $Al_x Ga_{1-x}As$ for making a channel region since the mobility of the electron in AlGaAs is relatively small but that in GaAs is large. Therefore, a channel region of an FET is preferably constituted by an n-type GaAs layer. To attain this, the n-type layer 14 should be made of GaAs. Thus, the bipolar transistor in FIG. 1 is a single heterojunction type bipolar transistor.

The fabrication of the device is as below: On a semi-insulating GaAs layer 10, a buffer layer 11 of undoped GaAs several hundred nanometers thick, an n-type $Al_{0.3}Ga_{0.7}As$ layer 12 approximately 200 nm thick doped with silicon (Si) in a concentration of approximately $1\times10^{17}$ cm$^{-3}$, a p-type GaAs layer 13 approximately 100 nm thick doped with beryllium (Be) in a concentration of approximately $1\times10^{19}$ cm$^{-3}$, and an n-type GaAs layer 14 approximately 200 nm thick doped with Si in a concentration of approximately $1\times10^{17}$ cm$^{-3}$ are continuously grown, for example, by molecular beam epitaxy (MBE) or by organometal-thermal-decomposition chemical-vapor-deposition (MOCVD). Al$_{0.3}$Ga$_{0.7}$As and GaAs have forbidden energy band gaps of 1.80 eV and 1.42 eV, respectively. From these layers 12 to 14, a heterojunction bipolar transistor and a MESFET are fabricated in the areas B and F, respectively.

Element isolation, i.e., isolation between a bipolar transistor and a MESFET, is effected by selective etching to make a groove passing through the layers 14 to 11 and reaching the substrate 10 and to form mesashaped regions of the layers 11 to 14 in the areas B and F respectively. Alternatively, element isolation may be effected by implantation of O+, B+ or H+ ions. The collector, base, and emitter regions 14, 13 and 12 are also shaped by selective etching.

Any electrode may be made of a conventional procedure. For example, an emitter electrode 16, a collector electrode 18 and source and drain electrodes 20, which should be in ohmic contact with the n-type AlGaAs or GaAs layer 12 or 14, are made by forming gold-germanium/gold (AuGe/Au) layers onto the layers 12 and 14 and heating them at approximately 450° C. for one minute for alloying purposes. Then, a base electrode 17, which should be in ohmic contact with the p-type GaAs layer 13, is made by forming gold/zinc (Au/Zn) layers on the layer 13 and heating them at approximately 350° C. for one minute for alloying purposes. Then, a gate electrode 19, which should be in Schottky contact with the n-type GaAs layer 14, is made by forming titanium/platinum/gold (Ti/Pt/Au) layers on the layer 14 in the area F. Wiring or interconnection between the elements may be carried out by any conventional procedure.

In this manner an AlGaAs/GaAs IC device, including a heterojunction bipolar transistor and a MESFET, is obtained.

Figure 2:
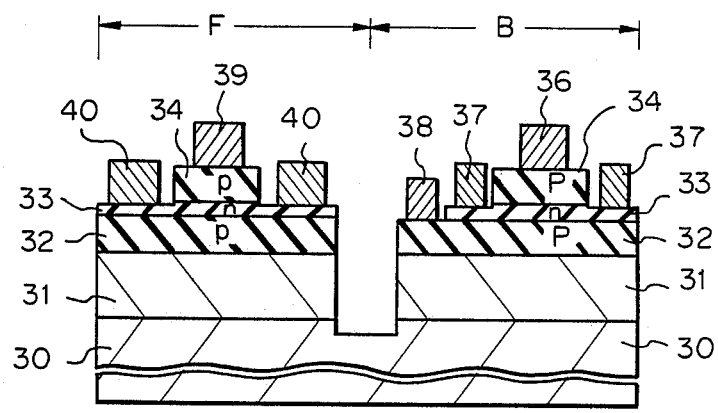
FIG. 2 is a sectional view of a second preferred embodiment of a compound semiconductor IC device in accordance with the present invention.

FIG. 2 illustrates a compound semiconductor IC device comprising a p-n-p type heterojunction bipolar transistor in an area B and a JFET in an area F. In the figure, reference numeral 32 denotes a p-type Al$_x$Ga$_{1-x}$As layer, 33 an n-type GaAs layer, 34 a p-type Al$_x$Ga$_{1-x}$As layer and 36 to 40 electrodes. Thus, the layers 32 to 34 in the area B constitute emitter, base, and collector regions, respectively, of a bipolar transistor with heterojunctions between the emitter and base regions and between the base and collector regions. The layer 33 in the area F constitutes a channel region of a JFET with a pn junction made by the layers 33 and 34.

While the n-p-n type is preferred for a compound semiconductor bipolar transistor, a p-n-p type bipolar transistor is also possible, especially where the pn junction between the emitter and base regions is a step-type junction and the width of the base region is reduced. The device in FIG. 2 does not necessarily have to have double heterojunctions. However, with double heterojunctions, the emitter and collector regions may optionally be used as collector and emitter regions, respectively. In this p-n-p type lamination of layers 32 to 33, then-type GaAs layer 33 is most preferable for the channel region of an FET. The p-type Al$_x$Ga$_{1-x}$As layer 34 on the n-type GaAs layer 33 does not necessarily have to be removed, however, and the pn junction between the layers 33 and 34 may be used as a junction type gate of a JFET, which is preferable since a JFET may allow a wide range of gate voltage which can be varied. Further, if the p-type Al$_x$Ga$_{1-x}$As layer 34 is left on the channel region, possible trouble in removing the layer 34 from channel region is eliminated. However, alternatively, a MESFET may be made.

The fabrication of the device in FIG. 2 is similar to that of the device in FIG. 1. The differences are as follows: On a semi-insulating GaAs layer 30, an undoped GaAs buffer layer 31, a p-type Al$_{0.3}$Ga$_{0.7}$As layer 32 approximately 200 nm thick doped with Be in a concentration of approximately $2\times10^{17}$ cm$^{-3}$, an n-type GaAs layer 33 approximately 50 nm thick doped with Si in a concentration of approximately $1\times10^{18}$ cm$^{-3}$, and a p-type Al$_{0.3}$Ga$_{0.7}$As layer 34 approximately 200 nm thick doped with Be in a concentration of approximately $2\times10^{17}$ cm$^{-3}$ are continuously grown. In selective etching of the p-type Al$_{0.3}$Ga$_{0.7}$As layer 34, shaping is effected not only in the area B for making the emitter or collector region but also in the area F for exposing the top surface of the n-type GaAs layer 33 on which source and drain electrodes 40 should be formed. At this time, a base electrode 37 and the source and drain electrodes 40 should be in ohmic contact with the n-type GaAs layer 33, and may be made of AuGe/Au layers. An emitter or collector electrode 36, a collector or emitter electrode 38, and a gate electrode 39 should be in ohmic contact with the p-type Al$_{0.3}$Ga$_{0.7}$As layers 32 or 34 and may be made of Au/Zn layers. There is no Schottky type electrode.

Alternatively, if a MESFET is desired in the area F, the p-type Al$_{0.3}$Ga$_{0.7}$As layer 34 in the area F is nonselectively removed and a gate electrode of Ti/Pt/Au layers is made on the n-type GaAs layer.

Figure 3:
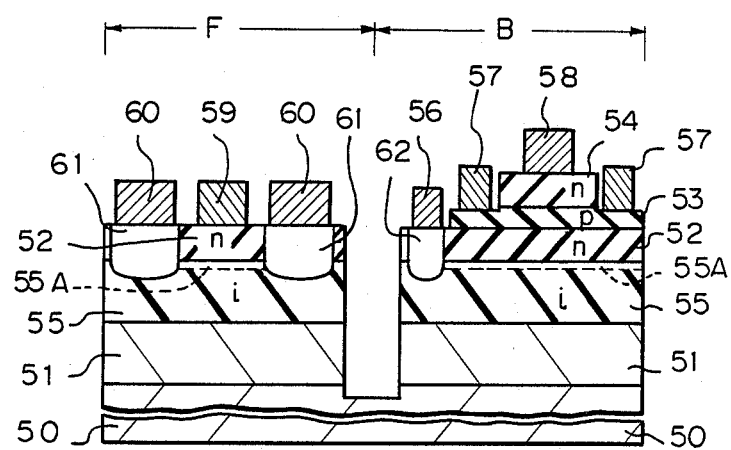
FIG. 3 is a sectional view of a third preferred embodiment of a compound semiconductor IC device in accordance with the present invention.

FIG. 3 illustrates a compound semiconductor IC device including a heterojunction bipolar transistor and a heterojunction FET. In the figure, reference numeral 51 denotes an undoped GaAs buffer layer, 52 an n-type Al$_x$Ga$_{1-x}$As layer, 53 a p-type GaAs layer, 54 an n-type GaAs layer, 55 an undoped GaAs layer, and 56 to 60 electrodes. In this constitution, the heterojunction bipolar transistor in the area B is similar to that in FIG. 1. In the FET in the area F, the gate channel is a two-dimensional electron gas 55A formed by electrons transmitted from the n-type Al$_x$Ga$_{1-x}$As layer 52 to the undoped GaAs layer 55 due to the larger electron affinity of the GaAs compared to the AlGaAs. As described before, such a two-dimensional electron gas has increased electron mobility since it exists in a semiconductor layer without doped impurities, a cause of scattering of electrons. The electron mobility of such a two-dimensional electron gas of a heterojunction FET may be made even higher by cooling the FET to depress the lattice vibration of the semiconductor layer where the electrons move. The two-dimensional electron gas is also formed in the area B, enabling decreased emitter resistance.

The fabrication of the device in FIG. 3 is similar to that of the device in FIG. 1. The differences between them are as follows:

An undoped GaAs layer 55 approximately 300 nm thick, is inserted between an undoped GaAs buffer layer 51 and an n-type Al$_x$Ga$_{1-x}$As layer 52. An n-type GaAs layer 54 and a p-type GaAs layer 53 in the area F are removed, and electrodes 59 and 60 are formed on the n-type Al$_{0.3}$Ga$_{0.7}$As layer 52 in the area F. Reference numeral 50 denotes a semi-insulating GaAs substrate. The material and procedures of making the electrodes 56 to 60 may be the same as those for the electrodes 16 to 20 in FIG. 1. The emitter electrode 56 and the source and drain electrodes 60 of AuGe/Au layers are heat-treated at approximately 450° C. for one minute. It is believed the heat treatment allows alloying of the materials of the electrodes and the compound semiconductor layer. The resultant alloy regions 61 and 62 may reach the undoped GaAs layer 55 through the n-type $Al_{0.3}Ga_{0.7}As$ layer. These alloy regions 61 and 62 allow ohmic contact between the electrodes 60 and 56 and the two dimensional electron gas 55A.

It should be noted that the above embodiments are examples and are not meant to limit the present invention. For example, the combination of the $Al_xGa_{1-x}As/GaAs$ may be replaced by $InP/Ga_xIn_{1-x}P_yAs_{1-y}$ ($0 \leq X \leq 1$, $0 \leq Y \leq 1$), $Al_xIn_{1-x}As/Ga_xIn_{1-x}P_yAs_{1-y}$ ($0 \leq X \leq 1$, $0 \leq Y \leq 1$) or other appropriate combinations of compound semiconductors. The buffer layer may be a superlattice layer.

As illustrated above, a heterojunction bipolar transistor and an FET may be integrated in a compound semiconductor IC chip or device by constructing a heterojunction bipolar transistor with n-p-n or p-n-p type three-compound semiconductor layers and an FET with at least one of the n-p-n or p-n-p type three-compound semiconductor layers.

The thus obtainable compound semiconductor IC device, including a heterojunction bipolar transistor and an FET according to the present invention, may be particularly useful in some cases. For example, in a memory cell device, FET's are suitable for memory cells due to low power consumption and high switching speed, but outputs of the FET's are not so high due to low driving capability, thereby decreasing the speed of transporting information from the memory cell device to, e.g., a CPU. If bipolar transistors having high driving capability can be included in a memory device as output buffers, together with FET's as memory cells, the above-mentioned problems are eliminated. Also, in a bipolar transistor IC device, FET's can be effectively used for a current source, thereby enabling a reduction of the supply voltage. Thus, inclusion of FET's in a bipolar transistor IC device is desirable in many applications.

I claim:

1. A compound semiconductor integrated circuit device including a bipolar transistor and a field effect transistor (FET), comprising:

a semi-insulating substrate having first and second areas, said bipolar transistor being over the first area and said FET being over the second area;

means for electrically isolating said bipolar transistor over the first area, from said FET over the second area;

a first compound semiconductor layer of a first conductivity on said semi-insulating substrate;

a second compound semiconductor layer of a second conductivity on said first compound semiconductor layer; and a third compound semiconductor layer of the first conductivity on said second compound semiconductor layer, at least one of said first and third compound semiconductor layers having a forbidden energy band gap larger than that of said second compound semiconductor layer;

an electrode formed over said first compound semiconductor layer;

said bipolar transistor comprising a base region of a part of said second compound semiconductor layer, an emitter region of a part of one of the at least one of said first and third compound semiconductor layers having a forbidden energy band gap larger than that of said second compound semiconductor layer, a collector region of a part of the other of the at least one of said first and third compound semiconductor layers, and said electrode over said first compound semiconductor layer;

said FET comprising a channel region, a part of one of the first, second, and third compound semiconductor layers forming one of the channel region and a region for supplying electrons to the channel region.

2. A device according to claim 1, wherein:
said first conductivity is n-type;
said second conductivity is p-type; and
said third compound semiconductor layer of n-type in the second area is the channel region of said FET.

3. A device according to claim 2, wherein said first compound semiconductor layer is $Al_xGa_{1-x}As$ and said second and third compound semiconductor layers are GaAs.

4. A device according to claim 2, wherein said first compound semiconductor layers is $Ga_xIn_{1-x}P_yAs_{1-y}$ and said second and third compound semiconductor layers are InP.

5. A device according to claim 2, wherein said first compound semiconductor layer is $Ga_xIn_{1-x}P_yAs_{1-y}$ and said second and third compound semiconductor layers are $Al_xIn_{1-x}As$.

6. A device according to claim 1, wherein:
said first conductivity is p-type;
said second conductivity is n-type; and
said second compound semiconductor layer of n-type in the second area is the channel region of said FET.

7. A device according to claim 6, further comprising a gate electrode on said third compound semiconductor layer in said second area, so that said FET is a junction-type FET.

8. A device according to claim 6, wherein said third compound semiconductor layer does not exist in the second area, said device further comprising a gate electrode on said second compound semiconductor layer in said second area, so that said FET is a metal-semiconductor FET.

9. A device according to claim 6, wherein said first and third compound semiconductor layers are $Al_xGa_{1-x}As$ and said second compound semiconductor layer is GaAs.

10. A device according to claim 6, wherein said first and third compound semiconductor layers are InP and said second compound semiconductor layer is $Ga_xIn_{1-x}P_yAs_{1-y}$.

11. A device according to claim 6, wherein said first and third compound semiconductor layers are $In_xGa_{1-x}As$ and said second compound semiconductor layer is $Ga_xIn_{1-x}P_yAs_{1-y}$.

12. A device according to claim 1, further comprising a fourth compound semiconductor layer under and adjacent to said first compound semiconductor layer in said first and second areas of said semi-insulating substrate, wherein said fourth compound semiconductor layer has an electron affinity larger than that of said first compound semiconductor layer, wherein said first conductivity is n-type, wherein said second conductivity is p-type, wherein a two-dimensional electron gas is formed of electrons transmitted from said first compound semiconductor layer to said fourth compound semiconductor layer, and wherein said two-dimensional electron gas is the channel region of said FET.

13. A device according to claim 12, wherein:
said first compound semiconductor layer is $Al_xGa_{1-x}As$;
said second, third, and fourth compound semiconductor layers are GaAs; and
said fourth compound semiconductor layer of GaAs is undoped.

14. A device according to claim 12, wherein:
said first compound semiconductor layer is InP;
said second, third, and fourth compound semiconductor layers are $Ga_xIn_{1-x}P_yAs_{1-y}$; and
said fourth compound semiconductor layer of $Ga_xIn_{1-x}P_yAs_{1-y}$ is undoped.

15. A device according to claim 12, wherein:
said first compound semiconductor layer is $Al_xIn_{1-x}As$;
said second, third, and fourth compound semiconductor layers are $Ga_xIn_{1-x}P_yAs_{1-y}$; and
said fourth compound semiconductor layer of $Ga_xIn_{1-x}P_yAs_{1-y}$ is undoped.

16. A compound semiconductor integrated circuit device including a bipolar transistor and a field effect transistor, comprising:
a semi-insulating substrate having first and second areas, the bipolar transistor being formed over the first area and the field effect transistor being formed over the second area;
means for electrically isolating the bipolar transistor formed over the first area from the field effect transistor formed over the second area;
a first compound semiconductor layer of a first conductivity type formed over the first and second areas of said semi-insulating substrate;
a second compound semiconductor layer of a second conductivity type formed on said first compound semiconductor layer over the first and second areas of said semi-insulating substrate; and
a third compound semiconductor layer of the first conductivity type formed on said second compound semiconductor layer over at least the first area of said semi-insulating substrate, at least one of said first and third compound semiconductor layers being a forbidden energy band gap greater than the forbidden energy band gap of said second compound semiconductor layer;
the bipolar transistor comprising the portions of said first, second and third compound semiconductor layers, which are over the first area of said semi-insulating substrate;
the field effect transistor comprising the portions of said first and second compound semiconductor layers, which are over the second area of said semi-insulating substrate.

17. A device according to claim 16, further comprising a gate electrode formed on said second compound semiconductor layer over the second area of said semi-insulating substrate, so that said field effect transistor is a metal-semiconductor field effect transistor (MESFET).

18. A device according to claim 16, wherein:
said third compound semiconductor layer is formed over the second area of said semi-insulating substrate;
said first conductivity type is n-type;
said second conductivity type is p-type; and
said third compound semiconductor layer over the second area of said semi-insulating substrate is the channel region of said FET.

19. A device according to claim 18, wherein:
said second compound semiconductor layer forms the base region of said bipolar transistor; and
the one of said first and third compound semiconductor layers which has a forbidden energy band gap greater than that of said second compound semiconductor layers, forms the emitter of said bipolar transistor.

20. A compound semiconductor integrated circuit device including a bipolar transistor and a field effect transistor, comprising:
a semi-insulating substrate having first and second areas, the bipolar transistor being formed over the first area and the field effect transistor being formed over the second area;
means for electrically isolating the bipolar transistor formed over the first area from the field effect transistor formed over the second area;
a first compound semiconductor layer formed over the first and second areas of said semi-insulating substrate;
a second compound semiconductor layer formed on said first compound semiconductor layer over the first area of said semi-insulating substrate;
a third compound semiconductor layer formed on said second compound semiconductor layer over the first area of said semi-insulating substrate;
a fourth compound semiconductor layer formed over the first and second areas of said semi-insulating substrate between said semi-insulating substrate and said first compound semiconductor layer, said first compound semiconductor layer having a forbidden energy band gap greater than the forbidden energy band gap of said fourth compound semiconductor layer;
the bipolar transistor comprising the portions of said first, second, third and fourth compound semiconductor layers which are over the first area of said semi-insulating substrate;
the field effect transistor comprising the portions of said first and fourth compound semiconductor layers which are over the second area of said semi-insulating substrate, a two-dimensional electron gas being formed of electrons transmitted from said first compound semiconductor layer to said fourth compound semiconductor layer, said two-dimensional electron gas forming the channel region of said field effect transistor.

* * * * *

UNITED STATES PATENT AND TRADEMARK OFFICE
CERTIFICATE OF CORRECTION

PATENT NO. : 4,821,090
DATED : APRIL 11, 1989
INVENTOR(S) : NAOKI YOKOYAMA

It is certified that error appears in the above-identified patent and that said Letters Patent is hereby corrected as shown below:

Col. 1, line 68, "semi-conductor" should be --semiconductor--.

Col. 3, line 23, "of" should be --by--;
      line 65, "then-type" should be --the n-type--.

Col. 6, line 26, "layers" should be --layer--;
      line 42, after "FET" insert --(JFET)--;
      line 48, after "FET" insert --(MESFET)--.

Col. 7, line 48, "being" should be --having--.

Signed and Sealed this

Seventh Day of November, 1989

Attest:

JEFFREY M. SAMUELS

Attesting Officer    Acting Commissioner of Patents and Trademarks